United States Patent
Wu et al.

(10) Patent No.: US 8,324,724 B2
(45) Date of Patent: Dec. 4, 2012

(54) LED ASSEMBLY AND MANUFACTURING METHOD THEREOF

(75) Inventors: Cheng-Tao Wu, Taipei (TW); Fon-Jein Hsieh, Taipei (TW); Xue-Mei Guo, Kunshan (CN)

(73) Assignee: Getac Technology Corporation, Hsinchu (TW)

( * ) Notice: Subject to any disclaimer, the term of this patent is extended or adjusted under 35 U.S.C. 154(b) by 0 days.

(21) Appl. No.: 13/024,261

(22) Filed: Feb. 9, 2011

(65) Prior Publication Data

US 2012/0025257 A1 Feb. 2, 2012

(30) Foreign Application Priority Data

Jul. 29, 2010 (TW) ................................ 99125190 A
Aug. 20, 2010 (TW) ................................ 99128040 A

(51) Int. Cl.
*H01L 21/00* (2006.01)
(52) U.S. Cl. .......... 257/709; 257/99; 257/706; 257/707; 438/122
(58) Field of Classification Search .................... 257/99, 257/706, 707, 709; 438/122
See application file for complete search history.

(56) References Cited

U.S. PATENT DOCUMENTS

| 5,857,767 | A | 1/1999 | Hochstein |
| 6,428,189 | B1 | 8/2002 | Hochstein et al. |
| 7,189,983 | B2 * | 3/2007 | Aguirre et al. ............. 250/504 R |
| 7,202,489 | B2 * | 4/2007 | Aguirre et al. ............. 250/504 R |
| 7,202,490 | B2 * | 4/2007 | Aguirre et al. ............. 250/504 R |
| 7,250,611 | B2 * | 7/2007 | Aguirre et al. ............. 250/461.1 |
| 7,329,887 | B2 * | 2/2008 | Henson et al. ............. 250/494.1 |
| 7,456,805 | B2 * | 11/2008 | Ouderkirk et al. ............. 345/32 |
| 8,003,416 | B2 * | 8/2011 | Lin et al. ......................... 438/26 |
| 8,206,010 | B2 * | 6/2012 | Chen ............................. 362/294 |

FOREIGN PATENT DOCUMENTS

| JP | 2005-012155 | 1/2005 |
| JP | 2007-116138 | 5/2007 |
| JP | 2010-129834 | 6/2010 |

* cited by examiner

*Primary Examiner* — Jarrett Stark
*Assistant Examiner* — Nicholas Tobergte

(57) ABSTRACT

An LED assembly including a heat sink, a surface treatment dielectric layer, an electrically conductive layer, a thermally conductive layer and an LED chip. The surface treatment dielectric layer is disposed on an upper surface of the heat sink and defines at least one first through hole to expose a portion of the upper surface. The electrically conductive layer is formed on the surface treatment dielectric layer, includes a plurality of electrical traces and defines at least one second through hole corresponding to the first through hole. The thermally conductive layer is formed in the first and the second through holes and directly contacted with a portion of the upper surface exposed from the overlapped region of the first through hole and the second through hole. The LED chip includes a plurality of electrodes electrically connected to the electrical traces and is directly contacted with the thermally conductive layer.

19 Claims, 6 Drawing Sheets

LED ASSEMBLY AND MANUFACTURING METHOD THEREOF

FIELD OF THE INVENTION

The present invention relates to a dissipating structure, and more particularly to a light emitting diode (LED) assembly with a dissipating structure.

BACKGROUND OF THE INVENTION

With proposal of global environmental protection, saving energy has become a trend of developing an industry. In recent years, LED industry is paid more and more attention. So far, LED products have advantages of low power consumption, high light emitting efficiency, fast response time, long lifespan, exempting from mercury pollution, and benefitting environmental protection, and so on. In particular, with the development of the high-power high-brightness light emitting diode (HB LED), LEDs are widely applied to an illuminating light source, a backlight of a display, a lighting device of an automobile, and a lighting device of a mini projector.

FIG. 1 is a schematic, cross-sectional view of a conventional LED assembly. Referring to FIG. 1, an LED assembly 100 includes a heat sink 102. A dielectric layer 110 is formed on an upper surface 104 of the heat sink 102. A patterned electrically conductive layer 112 is formed on the dielectric layer 110. A material of the patterned electrically conductive layer 112 can be copper. A solder paste 122 is disposed between an electrode 118 of an LED chip 116 and the patterned electrically conductive layer 112. The LED chip 116 is electrically connected to the patterned electrically conductive layer 112 through the solder paste 122.

In the conventional LED assembly 100, when the LED chip 116 emits light, heat generated from the LED chip 116 is transferred to the heat sink 102 through the solder paste 122, the patterned electrically conductive layer 112 and the dielectric layer 110 in sequence. Thus, the heat dissipation efficiency of the conventional LED assembly 100 is not satisfying, thereby affecting the light emitting efficiency of the LED chip 116.

SUMMARY OF THE INVENTION

The present invention provides an LED assembly with good heat dissipation efficiency.

The present invention also provides a manufacturing method of LED assembly, by which an LED assembly with good heat dissipation efficiency can be manufactured.

The present invention provides an LED assembly including a heat sink, a surface treatment dielectric layer, an electrically conductive layer, a thermally conductive layer and an LED chip. The heat sink has an upper surface. The surface treatment dielectric layer is disposed on the upper surface of the heat sink and defines at least one first through hole to expose a portion of the upper surface of the heat sink. The electrically conductive layer is formed on the surface treatment dielectric layer. The electrically conductive layer includes a plurality of electrical traces and defines at least one second through hole corresponding to the first through hole. The second through hole and the first through hole are at least partially overlapped so that a portion of the upper surface of the heat sink is exposed from an overlapped region of the first through hole and the second through hole. The thermally conductive layer is formed in the first through hole and the second through hole and is directly contacted with the portion of the upper surface of the heat sink exposed from the overlapped region of the first through hole and the second through hole. The LED chip includes a plurality of electrodes electrically connected to the electrical traces of the electrically conductive layer. The LED chip is directly contacted with the thermally conductive layer.

In one embodiment provided by the present invention, the thermally conductive layer includes a solder paste. In one embodiment provided by the present invention, the thermal conductive layer includes a heat dissipating adhesive.

The present invention also provides a manufacturing method of LED assembly including the following steps. A surface treatment dielectric layer is formed on an upper surface of a heat sink. The dielectric layer defines at least one first through hole to expose a portion of the upper surface of the heat sink. An eclectically conductive layer is formed on the surface treatment dielectric layer. The electrically conductive layer defines at least one second through hole corresponding to the first through hole to expose the first through hole from the second through hole at least partially. The electrically conductive layer is patterned to form a plurality of electrical traces. A thermally conductive layer is formed in the first through hole and the second through hole and is directly contacted with the upper surface of the heat sink. An LED chip is mounted so that a plurality of electrodes of the LED chip are electrically connected to the electrical traces of the electrically conductive layer and the LED chip is directly contacted with the thermally conductive layer.

In one embodiment provided by the present invention, the manufacturing method further includes a step of applying a surface treatment process to a surface of the thermally conductive layer and the upper surface of the heat sink to form a surface treatment layer, thereby improving a bonding force between the thermally conductive layer and the upper surface of the heat sink.

In the LED assembly of the present invention, the LED chip is directly mounted on the heat sink through the thermally conductive layer. Thus, the heat dissipating efficiency of the LED assembly is good, thereby improving the light emitting efficiency of the LED chip.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1:
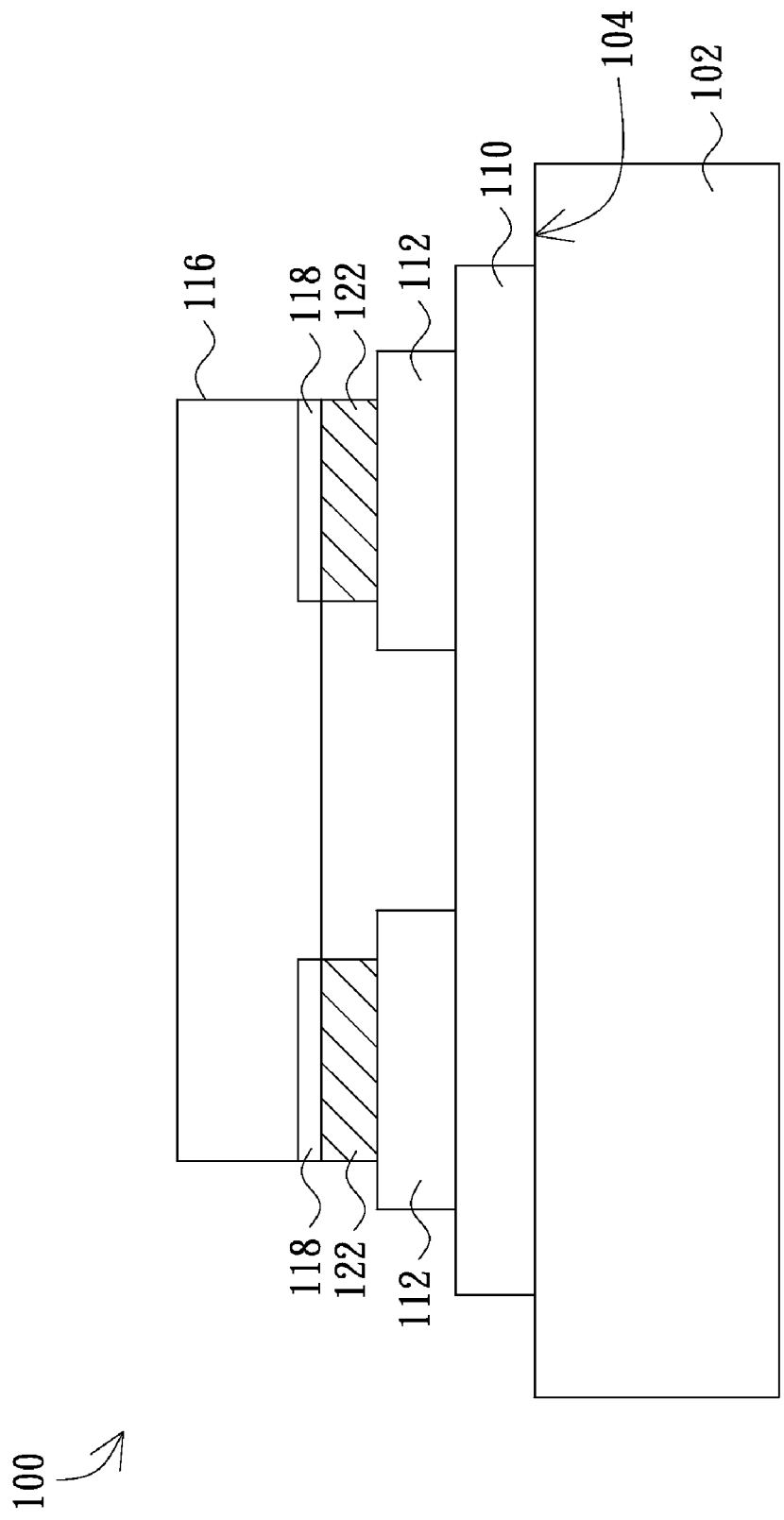
FIG. 1 illustrates a schematic, cross-sectional view of a conventional LED assembly.
Figure 2:
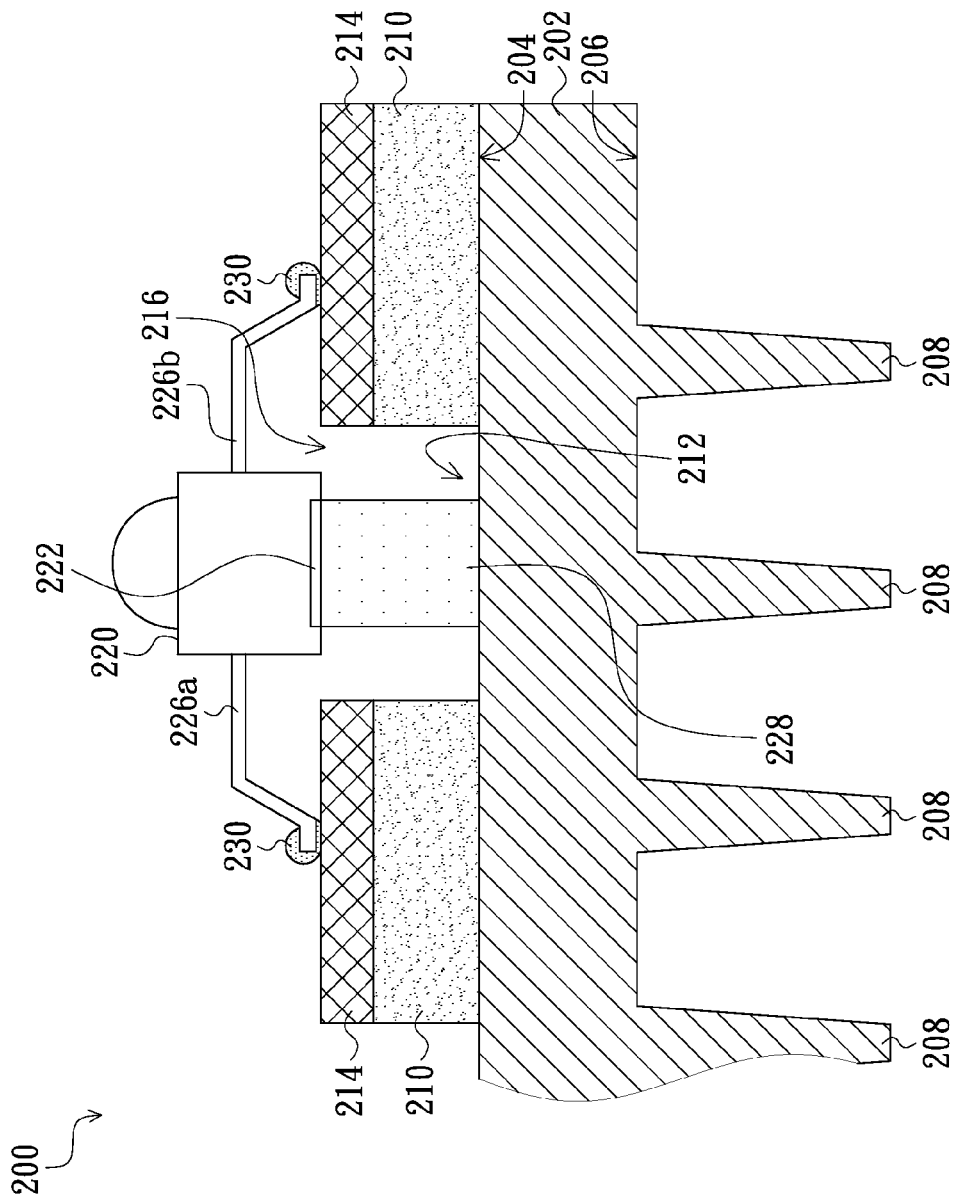
FIG. 2 illustrates a schematic, cross-sectional view of an LED assembly in accordance with a first embodiment of the present invention.

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

FIG. 2 illustrates a schematic, cross-sectional view of an LED assembly in accordance with a first embodiment of the present invention. Referring to FIG. 2, in the present embodiment, an LED assembly 200 includes a heat sink 202. A material of the heat sink 202 is, for example, aluminum alloy, magnesium alloy or other thermally conductive metal. The heat sink 202 has an upper surface 204 and a lower surface 206. A plurality of fins 208 is disposed on the lower surface 206 of the heat sink 202.

A surface treatment dielectric layer 210 is formed on the upper surface 204 of the heat sink 202. The surface treatment dielectric layer 210 is made of an insulating material, which is treated by a surface treatment process. The surface treatment process is, for example, a screen printing or an ink-jet printing. The insulating material of the surface treatment dielectric layer 210 can be, for example, aluminum oxide, which has excellent thermally conductive property and can be bonded with the heat sink 202 tightly. The surface treatment dielectric layer 210 defines at least one first through hole 212 so as to expose a portion of the upper surface 204 of the heat sink 202.

An electrically conductive layer 214 is formed on the surface treatment dielectric layer 210. A material of the electrically conductive layer 214 is an electrically conductive compound, for example, a copper paste including a plurality of copper particles and a resin, or a silver paste including a plurality of silver particles and a resin. The material of the electrically conductive layer 214 has an adhesive property and an electrically conductive property. The electrically conductive layer 214 defines at least one second through hole 216 corresponding to the at least one first through hole 212 to expose the corresponding first through hole 212. In detail, the second through hole 216 is located above the corresponding first through hole 212 and at least partially overlaps the corresponding first through hole 212. In the present embodiment, the second through hole 216 completely overlaps the corresponding first through hole 212. Thus, a portion of the upper surface 204 of the heat sink 202 is exposed from an overlapped region of the first through hole 212 and the second through hole 216.

An LED chip 220 is mounted within the first through hole 212 and the second through hole 216. The LED chip 220 includes a heat dissipating portion 222 and a pair of electrodes 226a, 226b. In the present embodiment, a heat dissipating grease 228 is disposed between the heat dissipating portion 222 of the LED chip 220 and the portion of the upper surface 204 of the heat sink 202 exposed from the overlapped region of the first through hole 212 and the second through hole 216. The heat dissipating grease 228 is directly contact with the upper surface 204 of the heat sink 202, and the LED chip 220 is directly contacted with the heat dissipating grease 228. Thus, the heat dissipating portion 222 of the LED chip 220 is mounted on the upper surface 204 of the heat sink 202 through the heat dissipating grease 228. The heat dissipating grease 228 is configured for being served as a thermally conductive layer. When the LED chip 220 works, heat generated from the LED chip 220 transfers to the heat sink 202 through the heat dissipating grease 228. In the present embodiment, the heat dissipating grease 228 can be a thermally conductive paste with electrically conductive property, for example, the copper paste or the silver paste. The heat dissipating grease 228 can also be a thermally conductive paste without electrically conductive property.

The electrodes 226a, 226b are respectively electrically connected to the electrically conductive layer 214. In the present embodiment, an electrically conductive adhesive 230 is disposed between the electrode 226a/226b and the electrically conductive layer 214 to fix and electrically connect the electrode 226a/226b and the electrically conductive layer 214.

Figure 3:
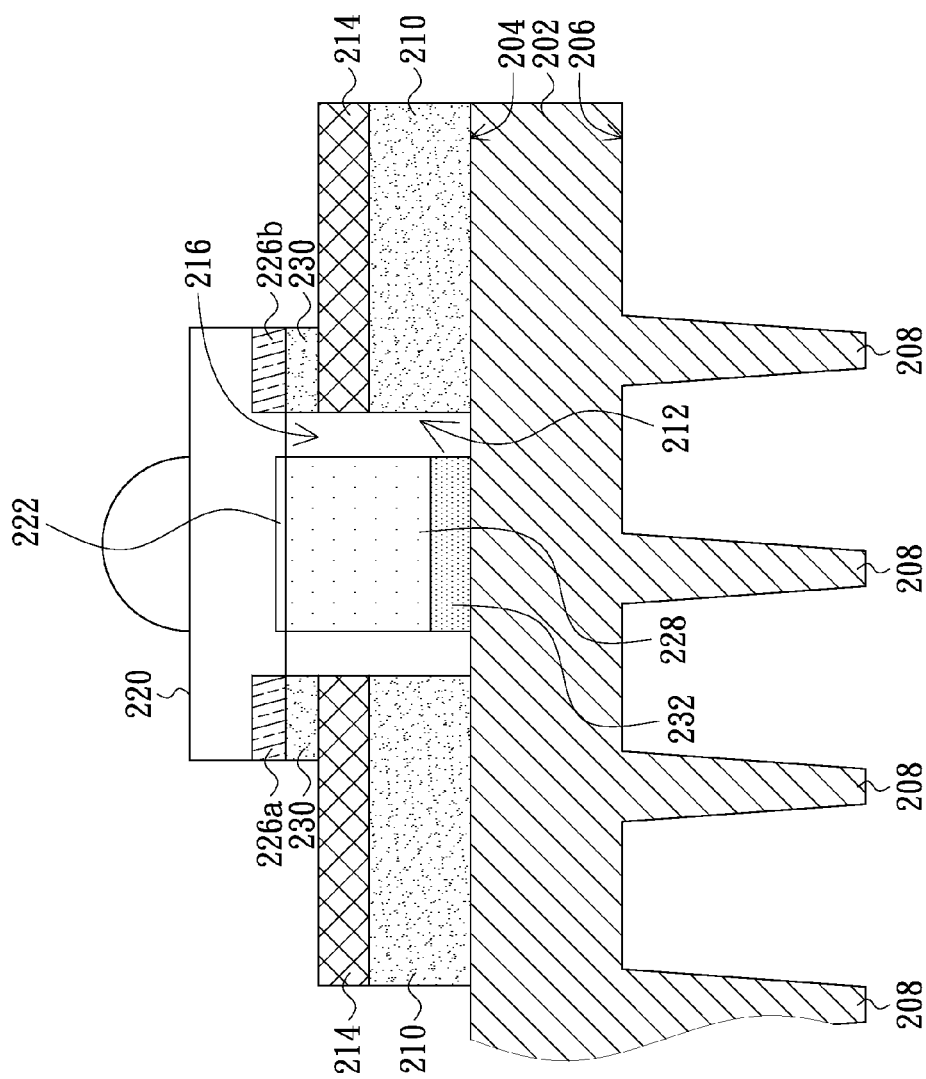
FIG. 3 illustrates a schematic, cross-sectional view of an LED assembly in accordance with a second embodiment of the present invention.

FIG. 3 illustrates a schematic, cross-sectional view of an LED assembly in accordance with a second embodiment of the present invention. Referring to FIG. 3, the LED assembly in the second embodiment is similar to the LED assembly 200 in the first embodiment. However, in the present embodiment, the structure of the LED chip 220 is different from the LED chip 220 in the first embodiment. Further, before forming the heat dissipating grease 228, the portion of the upper surface 204 of the heat sink 202 exposed from the first through hole 212 and the second through hole 216 is treated by an electroplating process or a sputtering process so as to enhance the bonding force between the heat dissipating grease 22 and the upper surface 204. In addition, a surface treatment process, for example, an electro-plating process or a sputtering process, can be applied to a surface of the heat dissipating grease 22 contacted with the upper surface 204 of the heat sink 202. Thus, a surface treatment layer 232 is formed between the heat dissipating grease 228 and the upper surface 204, thereby enhancing the bonding force between the heat dissipating grease 228 and the upper surface 204 of the heat sink 202.

Figure 4:
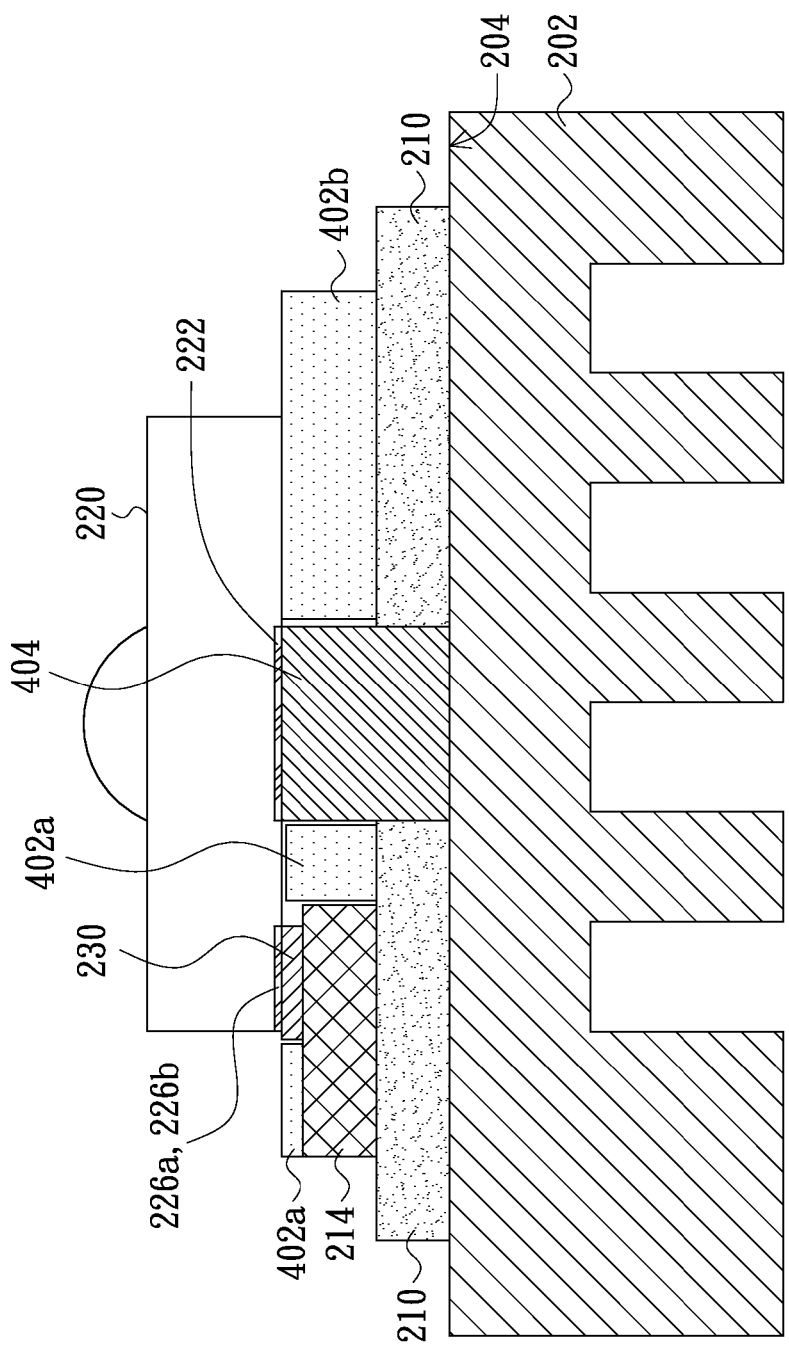
FIG. 4 illustrates a schematic, cross-sectional view of an LED assembly in accordance with a third embodiment of the present invention.

FIG. 4 illustrates a schematic, cross-sectional view of an LED assembly in accordance with a third embodiment of the present invention. Referring to FIG. 4, an LED assembly 400 in the third embodiment is similar to the LED assembly in the second embodiment. However, in the present embodiment, a number of protecting layers 402a, 402b are formed on the electrically conductive layer 214 and the surface treatment dielectric layer 210 respectively. In the present embodiment, the electrodes 226a, 226b of the LED chip 220 are located at a side of the LED chip 220. In addition, in the present embodiment, a heat dissipating adhesive 404 is disposed between and contacted with the heat dissipating portion 222 of the LED chip 220 and the upper surface 204 of the heat sink 202. Thus, the heat dissipating portion 222 of the LED chip 220 is mounted on the upper surface 204 of the heat sink 202 through the heat dissipating adhesive 404. The heat dissipating adhesive 404 is configured for being served as a thermally conductive layer. Because the heat dissipating adhesive 404 has stronger adhesion than the heat dissipating grease 228 in the aforesaid embodiments, the bonding force between the heat sink 202 and the LED chip 220 can be further enhanced.

Additionally, the protecting layer 402a is formed on a portion of the electrically conductive layer 214 and is formed between the electrically conductive layer 214 and the heat dissipating adhesive 404. Thus, the electrically conductive layer 214 can be protected from damage. Similarly, in the present embodiment, the protecting layer 402b is formed on the at least a portion of the surface treatment dielectric layer 210 to protect the surface treatment dielectric layer 210.

Figure 5:
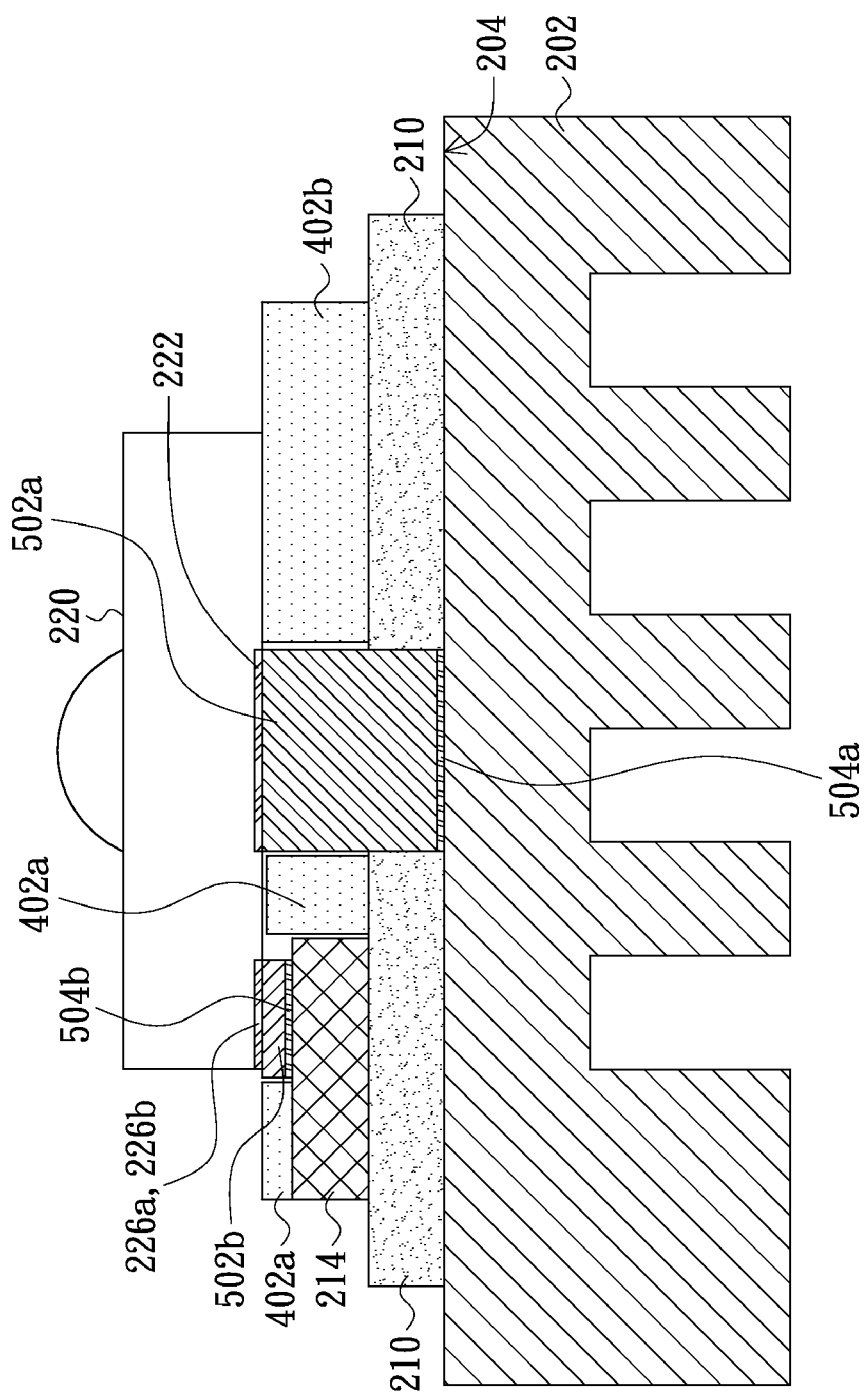
FIG. 5 illustrates a schematic, cross-sectional view of an LED assembly in accordance with a fourth embodiment of the present invention.

FIG. 5 illustrates a schematic, cross-sectional view of an LED assembly in accordance with a fourth embodiment of the present invention. Referring to FIG. 5, an LED assembly 500 in the present embodiment is similar to the LED assembly 400 in the third embodiment. However, in the present embodiment, a solder paste 502a replaces the heating dissipating adhesive 404 in the third embodiment. Further, a surface treatment process can be applied to a surface of the solder paste 502a or the upper surface 204 of the heat sink 202. Thus, a surface treatment layer 504a is formed between the solder paste 502a and the upper surface 204, thereby enhancing the bonding force between the solder paste 502a and the upper surface 204 of the heat sink 202.

Particularly, in the present embodiment, the solder paste 502a is also disposed between the electrode 226a and the electrically conductive layer 214. The electrode 226a is bonded to and electrically connected to the electrically conductive layer 214 through the solder paste 520a. Similarly, a surface treatment process can be applied to form a surface treatment layer 504a between the solder paste 502a and the electrically conductive layer 214.

Figure 6:
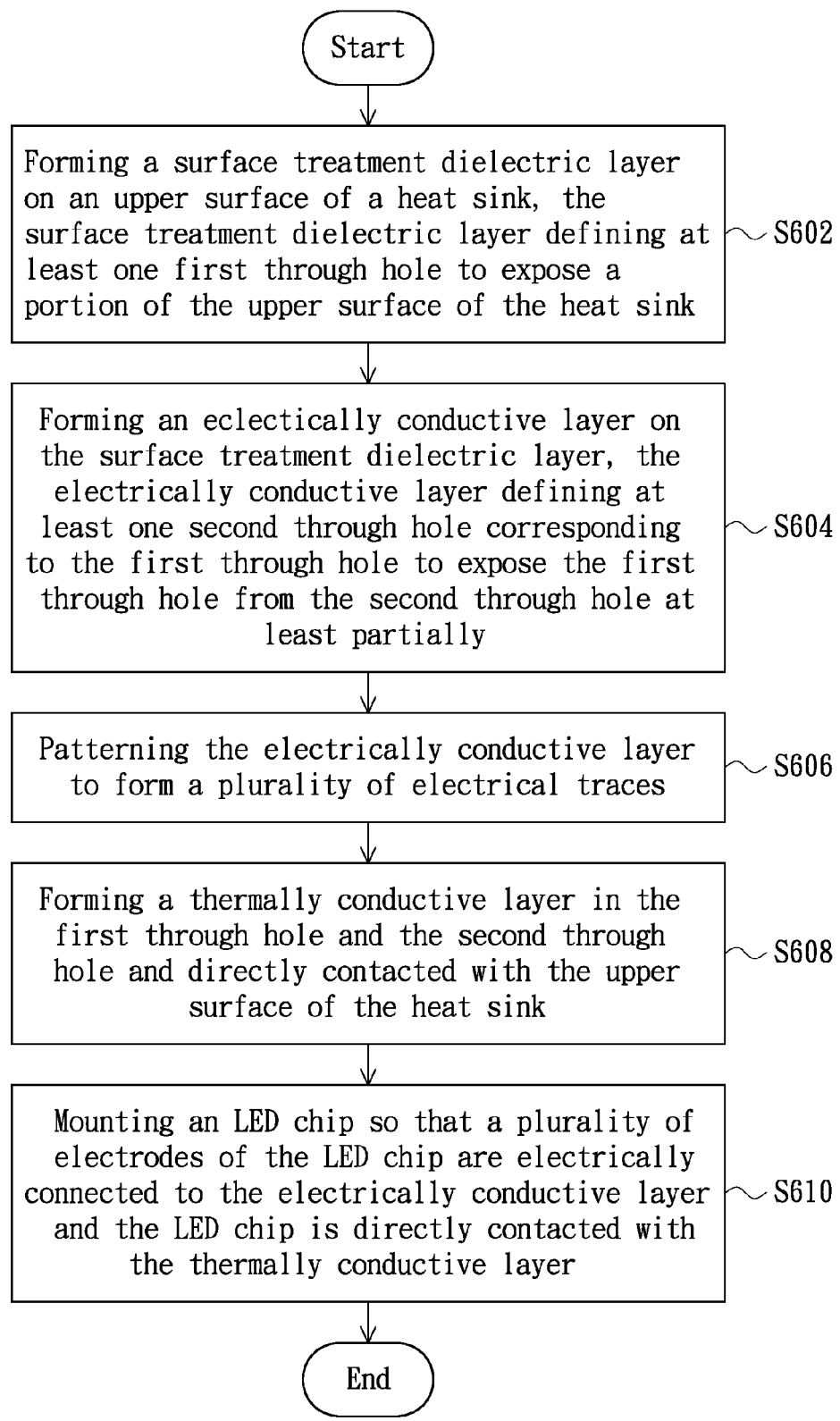
FIG. 6 illustrates a flow chart of a manufacturing method of an LED assembly in accordance with an embodiment of the present invention.

FIG. 6 illustrates a flow chart of a manufacturing method of an LED assembly in accordance with an embodiment of the present invention. Referring to FIG. 6, at first, in a step S602, a surface treatment dielectric layer is formed on an upper surface of a heat sink. At least one first through hole is formed in the surface treatment dielectric layer so as to expose the portion of the upper surface of the heat sink. The surface treatment dielectric layer can be formed by a screen printing process or other coating process. Next, in a step S604, an electrically conductive layer is formed on the surface treatment dielectric layer. At least one second through hole is formed in the electrically conductive layer so as to expose the corresponding first through hole. Thus, the second through hole and the corresponding first through hole are partially overlapped. The portion of the upper surface of the heat sink is exposed from the overlapped region of the first through hole and the corresponding second through hole. In the present embodiment, the electrically conductive layer is formed by a screen printing method or an ink ink-jet method. In another embodiment, the electrically conductive layer can also be formed by a sputtering process. Next, in a step S606, a plurality of electrical traces can be formed so as to form the patterned electrically conductive layer.

In addition, in a step S608, a heat dissipating layer is formed in the first through hole and the corresponding second through hole. An LED chip is mounted on the upper surface of the heat sink through the heat dissipating layer. In some embodiments, a surface treatment process is applied to the bonding surface between the heat dissipating layer and the upper surface of the heat sink so as to enhance the bonding force between the heat dissipating layer and the upper surface of the heat sink. Next, in a step S610, a pair of electrodes of the LED chip are bonded to and electrically connected to the electrical traces of the electrically conductive layer. In some embodiments, an electrically conductive adhesive is disposed between the electrodes of the LED chip and the electrically conductive layer. The electrodes of the LED chip are boned to and electrically connected to the electrical traces of the electrically conductive layer through the electrically conductive adhesive.

In summary, the LED chip is directly mounted on the heat sink through a thermal conductive layer. Thus, the heat dissipating efficiency of the LED assembly is good, thereby improving the light emitting efficiency of the LED chip.

Additionally, the surface treatment dielectric layer and the electrically conductive layer can also be formed on the heat sink by a coating method, thereby improving the heat dissipating efficiency of the LED assembly.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An LED assembly, comprising:
a heat sink having an upper surface;
a surface treatment dielectric layer formed on the upper surface of the heat sink, the surface treatment dielectric layer defining at least one first through hole to expose a portion of the upper surface of the heat sink;
an electrically conductive layer formed on the surface treatment dielectric layer, the electrically conductive layer having a plurality of electrical traces and defining at least one second through hole corresponding to the first through hole, the second through hole and the first through hole being at least partially overlapped so that a portion of the upper surface of the heat sink is exposed from an overlapped region of the first through hole and the second through hole;
a thermally conductive layer formed in the first through hole and the second through hole and directly contacted with the upper surface of the heat sink; and
an LED chip, having a plurality of electrodes electrically connected to the electrical traces of the electrically conductive layer, being contacted with the thermally conductive layer so that heat generated form the LED chip transfers to the portion of the upper surface of the heat sink exposed from the overlapped region of the first through hole and the second through hole through the thermally conductive layer.

2. The LED assembly as claimed in claim 1, wherein a material of the heat sink is either an aluminum alloy or a magnesium alloy.

3. The LED assembly as claimed in claim 1, wherein the thermally conductive layer comprises a solder paste.

4. The LED assembly as claimed in claim 3, wherein a portion of the electrically conductive layer contacting with the solder paste is treated by either an electro-plating process or a sputtering process.

5. The LED assembly as claimed in claim 3, wherein a portion of the upper surface of the heat sink contacting with the solder paste is treated by either an electro-plating process or a sputtering process.

6. The LED assembly as claimed in claim 1, further comprising an electrically conductive adhesive disposed between each of the electrodes and the electrically conductive layer.

7. The LED assembly as claimed in claim 1, wherein the surface treatment process is either a screen printing or an ink-jet printing.

8. The LED assembly as claimed in claim 1, wherein the surface treatment dielectric layer comprises an insulating material.

9. The LED assembly as claimed in claim 8, wherein the insulating material comprises aluminum oxide.

10. The LED assembly as claimed in claim 1, wherein a material of the electrically conductive layer is an electrically conductive compound.

11. The LED assembly as claimed in claim 10, wherein the electrically conductive compound is either a copper paste or a silver paste.

12. The LED assembly as claimed in claim 1, wherein the portion of the upper surface of the heat sink exposed from the overlapped region of the first through hole and the second through hole is treated by either an electro-plating process or a sputtering process.

13. The LED assembly as claimed in claim 1, wherein the thermal conductive layer comprises a heat dissipating adhesive.

14. A manufacturing method of LED assembly, comprising:

forming a surface treatment dielectric layer on an upper surface of a heat sink, the surface treatment dielectric layer defining at least one first through hole to expose a portion of the upper surface of the heat sink;

forming an eclectically conductive layer on the surface treatment dielectric layer, the electrically conductive layer defining at least one second through hole corresponding to the first through hole to expose the first through hole from the second through hole at least partially;

patterning the electrically conductive layer to form a plurality of electrical traces;

forming a thermally conductive layer in the first through hole and the second through hole and directly contacted with the upper surface of the heat sink; and mounting an LED chip so that a plurality of electrodes of the LED chip are electrically connected to the electrically conductive layer and the LED chip is directly contacted with the thermally conductive layer.

15. The LED assembly as claimed in claim 14, wherein the surface treatment process is either a screen printing or an ink-jet printing.

16. The LED assembly as claimed in claim 14, wherein the electrically conductive layer is formed by a sputtering process.

17. The LED assembly as claimed in claim 14, before forming the thermally conductive layer on the heat sink, further comprising applying a surface treatment process to a surface of the thermally conductive layer and the upper surface of the heat sink to form a surface treatment layer.

18. The LED assembly as claimed in claim 17, wherein the surface treatment process is either an electro-plating process or a sputtering process.

19. The LED assembly as claimed in claim 14, wherein in the step of mounting the LED chip, the electrodes are electrically connected to the electrically conductive layer through either an electrically conductive adhesive or a solder paste.

* * * * *